US008332254B2

(12) United States Patent
Facciorusso et al.

(10) Patent No.: US 8,332,254 B2
(45) Date of Patent: Dec. 11, 2012

(54) AUTOMATIC INSERTION POINT IDENTIFICATION IN MODEL MERGING OPERATIONS

(75) Inventors: Christian Facciorusso, Adliswil (CH); Felix Feger, Munich (DE); Jana Koehler, Oberrieden (CH); Jochen M. Kuester, Zurich (CH)

(73) Assignee: International Business MAchines Corporation, Armonk, NY (US)

( * ) Notice: Subject to any disclaimer, the term of this patent is extended or adjusted under 35 U.S.C. 154(b) by 1258 days.

(21) Appl. No.: 12/079,677

(22) Filed: Mar. 28, 2008

(65) Prior Publication Data

US 2008/0255815 A1 Oct. 16, 2008

(30) Foreign Application Priority Data

Mar. 30, 2007 (EP) ...................................... 0715384

(51) Int. Cl.
*G06Q 10/00* (2012.01)
(52) U.S. Cl. ...................................................... 705/7.27
(58) Field of Classification Search .................. 705/7.27
See application file for complete search history.

(56) References Cited

U.S. PATENT DOCUMENTS

| 7,703,027 | B2 * | 4/2010 | Hsu et al. ........................ 715/763 |
| 7,814,470 | B2 * | 10/2010 | Mamou et al. ................. 717/162 |
| 2002/0158864 | A1 * | 10/2002 | Matichuk ........................ 345/418 |
| 2005/0022116 | A1 * | 1/2005 | Bowman et al. ............... 715/513 |
| 2006/0064667 | A1 * | 3/2006 | Freitas ........................... 717/104 |
| 2006/0130011 | A1 * | 6/2006 | Cornell et al. ................. 717/136 |
| 2006/0168577 | A1 * | 7/2006 | Melo et al. ..................... 717/168 |
| 2007/0245297 | A1 * | 10/2007 | Kuester et al. ................. 717/104 |

OTHER PUBLICATIONS

Koehler, Jana and Hauser Rainer. "Untangling Unstructured Cyclic Flows—A Solution Based on Continuations." IBM Zurich Research Laboratory, Switzerland, Aug. 2004.*
Gerth, Christian, "Business Process Merging an approach based on Single-Entry-Single Exit Regions," Universitat Paderborn, Oct. 12, 2007.*
Pottinger, Rachel A. and Bernstein, Phillip A. "Merging Models Based on Given Correspondences." Proceedings of the 29th VLDB Conference, Berlin, Germany, 2003.*
Sun, Shuang, Kumar, Akhil and Yen, John,"Merging Workflows: A new perspective on connecting business processes," Decision Support Systems, vol. 42, No. 2, Nov. 2006, pp. 844-858.*

(Continued)

*Primary Examiner* — Beth V Boswell
*Assistant Examiner* — Renae Feacher
(74) *Attorney, Agent, or Firm* — William Stock; Anne Vachon Dougherty

(57) ABSTRACT

Methods and systems are provided for automatic identification of an insertion point. Comparison defining the correspondence between elements of models is done. The sequence order of elements in the second model is analyzed to identify predecessor and successor elements of the element t. The comparison is used to identify a set of transferred predecessors ($P_{trans}$), comprising elements of the first model which correspond to predecessor elements ($P_S$) in the second model, and a set of transferred successors ($S_{trans}$) comprising elements of the first model which correspond to successor elements ($S_S$) in the second model. Then, positions of the elements x, y in the sequence order of the first model are compared with the positions of elements in the sets of transferred predecessors and successors ($P_{trans}$, $S_{trans}$). An edge between the elements x and y is identified as an insertion point.

19 Claims, 4 Drawing Sheets

OTHER PUBLICATIONS

Engel, Klaus-D, Paige, Richard F., And Kolovos, Dimitrios. "Using a Model Merging Langugage for Reconciling Model Versions," Springer-Verlag Berlin Heidelberg, ECMDDA-FA 2006, LNCS 4066, pp. 143-157, 2006.*

Kolovos, Dimitrios S., Paige, Richard F. And Polack, Fiona A.C. "Merging Models with the Epsilon Merging Language (EML)." Springer-Verlag Berlin Heidelberg 2006, MoDELS: 2006, LNCS 4199, pp. 215-229, 2006.*

Letkeman, Kim,"Comparing and Merging UML Models in IBM Rational Software Architect:Part 3," developerWorks, IBM, Aug. 2005,http://www.ibm.com/developerworks/rational/library/05/802_comp3/.*

Bezivin, et al. "A Canonical Scheme for Model Composition", 2006, ECDMA-FA 2006, LNCS 4066, pp. 346-360.

Grossmann, et al, "Definition of Business Process Integraion Operators for Generalization", May 2005, ICEIS 2005, vol. 3, pp. 510-517.

Grossmann, et al, "Behavior Based Integration of Composite Business Processes", BOM 2005, LNCS 3647, pp. 186-204.

Kuster, et al, "Improving Business Process Models with Reference Models in Business-Driven Development", 2006, BPM 2006, LNCS 4103, p. 35-44.

Mendling, et al, "Business Process Design by View Integration", 2006, BPM 2006, LNCS 4103, pp. 55-64.

Sun, et al, "Merging Workflows: A New Perspective on Connecting Business Processes" (Nov. 2006), vol. 42, No. 2, pp. 844-858.

* cited by examiner

AUTOMATIC INSERTION POINT IDENTIFICATION IN MODEL MERGING OPERATIONS

FIELD OF THE INVENTION

This invention relates generally to automatic identification of insertion points in model merging operations. Methods, systems and computer programs are described for the automatic identification of insertion points in one model for specified elements of another model.

BACKGROUND OF THE INVENTION

Model-driven engineering (MDE) is a technique employed in various engineering fields such as software, system and data engineering. MDE involves the systematic use of models as primary engineering artifacts. For example, model-driven software development or model-driven business transformation relies on the use of models such as models defined in the Unified Modeling Language (UML). When dealing with such models, a model merging scenario often arises where two or more models have to be brought together in some way. One scenario for model merging is the improvement of an existing model by a reference model, where some parts of the existing model should be preserved and others should be replaced. Model merging is also required when two different models need to be brought into some degree of conformity. An example of this is the merging of business process models when companies are subject to acquisitions and mergers. In such situations, processes have to be aligned at the business and IT level, while identifying and preserving differences where appropriate. Another merging scenario arises if two or more different versions of the same model need to be integrated. For example, where models are manipulated in a distributed manner by several modelers, changes made in different models must be consolidated at some point and an integrated, consolidated model created. Here, differences must be analyzed and parts of different copies must be merged into the integrated model. In all such model merging operations, it is often necessary to add specific elements of one model to another model. When an element is to be added to a model, a suitable point for inserting the element must be identified. In particular, the insertion point should be such that addition of the element does not cause conflicts by violating sequence order requirements in the control flow of the model.

When merging two models as described above, a comparison of the two models must be established which identifies correspondences between elements of the two models. A technique for comparing models using different types of correspondences between model elements is disclosed in "Improving Business Process Models with Reference Models in Business-Driven Development", J. M. Küster, J. Koehler, K. Ryndina, 2nd Workshop on Business Processes Design (BPD'06), LNCS, Springer-Verlag, September 2006. This describes how the existence of certain types of correspondence between model elements can be used to select a suitable merging operation, but does not address the problem of identifying insertion points. Various other techniques have been proposed relating to model merging. For example, S. Sun et al., "Merging Workflows: A new perspective on connecting business processes", Journal of Decision Support Systems, Volume 42, Issue 2, November 2006, pages 844-858, Elsevier, describes how two workflows can be merged using merge points and distinguishes between replacement merge operations, for replacement of workflow parts, and insertion merge operations for insertion of workflow parts at a certain merge point. This system does not provide for identification of merge points, but simply assumes the merge points are specified in advance. Grossmann et al., "Definition of Business Process Integration Operators for Generalizations", Proceedings 7th International Conference on Enterprise Information Systems, ICEIS 2005, May 24-28 2005, and "Behavior Based Integration of Composite Business Processes", 3rd International Conference on Business Process Management, BPM 2005, Sep. 5-8, 2005, LNCS 3649, pages 186-204, Springer-Verlag, describe process integration operators that are based on activity correspondences between models. Again, this approach requires merge points, defined by the correspondences, to be predefined. A similar approach for merging EPC (Event-Driven Process Chains) models is described by J. Mendling and C. Simon, in "Business Process Design by View Integration", J. Eder et al., eds.: Proceedings of the BPM 2006 Workshops, Workshop on Business Process Design BPD 2006, Sep. 5-7, 2006, Vienna, Austria. General work on model merging and model composition which establishes common terminology and develops languages for defining correspondences as well as tool support is disclosed in Bezivin et al., "A Canonical Scheme for Model Composition", Proceedings Model Driven Architecture—Foundations and Applications: Second European Conference, ECMDA-FA 2006, LNCS 4066, Springer-Verlag, pages 346-360, 2006. Again, however, the particular problem of insertion point identification is not addressed.

SUMMARY OF THE INVENTION

One aspect of the present invention provides a method for automatic identification, in a data processing system, of an insertion point in a first model stored in memory of the system for a predetermined element t of a second model. The method comprises:

providing in the memory a comparison of the first and second models defining the correspondence between elements of the models;

analyzing the sequence order of elements in the second model to identify predecessor and successor elements of the element t in the second model;

using said comparison to identify a set of transferred predecessors, comprising elements of the first model which correspond to said predecessor elements in the second model, and a set of transferred successors comprising elements of the first model which correspond to said successor elements in the second model; and for pairs of adjacent elements x, y in the first model, comparing the positions of the elements x, y in the sequence order of the first model with the positions of elements in the sets of transferred predecessors and successors, and identifying an edge between the elements x and y as an insertion point if the position of the edge relative to the transferred predecessors and successors is not inconsistent with the sequence order of the element t and the predecessor and successor elements in the second model.

The present invention is predicated on the realization that a meaningful insertion point in the first model should ideally preserve the sequence order of elements (tasks, sub-processes, etc.) that is given in the second model. This requirement is based on the assumption that the sequential relationship between elements in the second model can contain sequential dependencies that should not be violated after the addition. This is important, for example, if predecessors of a task provide data objects that have to be available for later tasks. In embodiments of the present invention, the order of elements in the second model is analyzed to identify predecessor and successor elements of the element t to be added to the first model. Predecessor elements are those which precede the element t in the sequence order, and successor elements are those which succeed the element t in the sequence order. The resulting order information is then effectively transferred to the first model by making use of a predefined comparison of the first and second models specifying the correspondence between elements of the two models. Specifically, the comparison is used to identify two sets of elements in the first model: a set of transferred predecessors, comprising elements corresponding to the predecessor elements in the second model; and a set of transferred successors comprising elements corresponding to the successor elements in the second model. A search is then conducted for an edge between a pair of adjacent elements x, y in the first model which constitutes a meaningful insertion point for the element t. Specifically, for pairs of elements x, y, the positions of the elements x, y in the sequence order of the first model are compared with the positions of elements in the sets of transferred predecessors and successors. By performing this comparison, the system can determine whether or not the position in the sequence order of the edge (x,y) between elements x and y is inconsistent with the sequence order of the element t and its predecessor and successor elements in the second model. If not, the edge will be identified as an insertion point for the element t. This edge will be a meaningful insertion point, referred to hereinafter as a valid insertion point (VIP), since the sequence order of elements in the second model has not been violated. Thus, by utilizing the concept of transferred predecessors and successors in analysis of the element ordering in the first model, embodiments of the invention provide a simpler and more efficient mechanism for automatic identification of valid insertion points. More accurate insertion points can be identified since the sequence order of elements in both models is respected, and the substantial overhead associated with manual identification of insertion points is reduced.

The decision as to whether the relative position of the edge (x,y) and the transferred predecessors and successors is inconsistent with the aforementioned sequence order in the second model can be implemented with different degrees of stringency. In a strict implementation, the position of the edge (x,y) relative to the transferred predecessors and successors may be deemed not inconsistent with the sequence order in the second model if:

(a) the element x is a successor of all transferred predecessors except itself, and
(b) the element y is a predecessor of all transferred successors except itself.

In other words, all of the transferred predecessors must precede a VIP and all transferred successors must succeed a VIP. This effectively requires the sequence orders in the two models to be fully consistent for a VIP to be identified. In a less stringent implementation, the position of the edge (x,y) relative to the transferred predecessors and successors may be deemed not inconsistent with the sequence order in the second model if (c) the element x is either a successor of, or is not ordered with respect to, all transferred predecessors except itself, OR
(d) the element x is a disjunctive element that does not satisfy condition (c) AND the element y satisfies condition (c)

AND (e) the element y is either a predecessor of, or is not ordered with respect to, all transferred successors except itself, OR (f) the element y is a conjunctive element that does not satisfy condition (e) AND the element x satisfies condition (e).

The effect of this, more relaxed, criterion for identification of a VIP will be discussed in detail below. Such a less-stringent criterion may be useful in certain circumstances, for example if no VIP is identified with the strict implementation. Thus, embodiments of the invention might be selectively operable in two modes, the strict criterion being applied in one mode and the relaxed criterion in the other. Particularly preferred embodiments operate in the "strict mode" in a first pass of the insertion point identification process, and, if no insertion point is identified in the first pass, operate in the "relaxed mode" in a second pass of the process. In addition, while embodiments which identify only a single VIP, if available, might be envisaged, preferred embodiments identify all possible VIPs in the model.

While alternatives might be envisaged, for simplicity of operation preferred embodiments perform the aforementioned comparing step for every pair of adjacent elements x, y in the first model. However, the position need not necessarily be compared with that of every transferred predecessor and successor. In particular, the sequence order of elements in the sets of transferred predecessors and successors could be analyzed to identify the sequentially last transferred predecessor and the sequentially first transferred successor. In this case the positions of the elements x, y could simply be compared with the positions of the sequentially last transferred predecessor and the sequentially first transferred successor.

A second aspect of the invention provides a computer program comprising program code for causing a data processing system to perform a method according to the first aspect of the invention. It will be understood that "data processing system" is used here in the most general sense and includes any device, component or distributed system which has a data processing capability for implementing a computer program. Such a computer program may thus comprise separate program modules for controlling different components of a distributed system where provided. Moreover, a computer program embodying the invention may constitute an independent program or may be a component of a larger program, and may be supplied, for example, embodied in a computer-readable medium such as a disk or an electronic transmission for loading in a computer system. The program code of the computer program may comprise any expression, in any language, code or notation, of a set of instructions intended to cause data processing system to perform the method in question, either directly or after either or both of (a) conversion to another language, code or notation, and (b) reproduction in a different material form.

A third aspect of the invention provides a system for automatic identification of an insertion point in a first model for a predetermined element t of a second model. The system comprises memory for storing the first model and a comparison of the first and second models which defines the correspondence between elements of the models, and control logic adapted to:

analyze the sequence order of elements in the second model to identify predecessor and successor elements of the element t in the second model;

use said comparison to identify a set of transferred predecessors, comprising elements of the first model which correspond to said predecessor elements in the second model, and a set of transferred successors comprising elements of the first model which correspond to said successor elements in the second model; and for pairs of adjacent elements x, y in the first model, to compare the positions of the elements x, y in the sequence order of the first model with the positions of elements in the sets of transferred predecessors and successors, and to identify an edge between the elements x and y as an insertion point if the position of the edge relative to the transferred predecessors and successors is not inconsistent with the sequence order of the element t and the predecessor and successor elements in the second model.

Where features are described herein with reference to an embodiment of one aspect of the invention, corresponding features may be provided in embodiments of another aspect of the invention.

BRIEF DESCRIPTION OF THE DRAWINGS

Preferred embodiments of the invention will now be described, by way of example, with reference to the accompanying drawings in which.

DETAILED DESCRIPTION OF THE INVENTION

Figure 1:
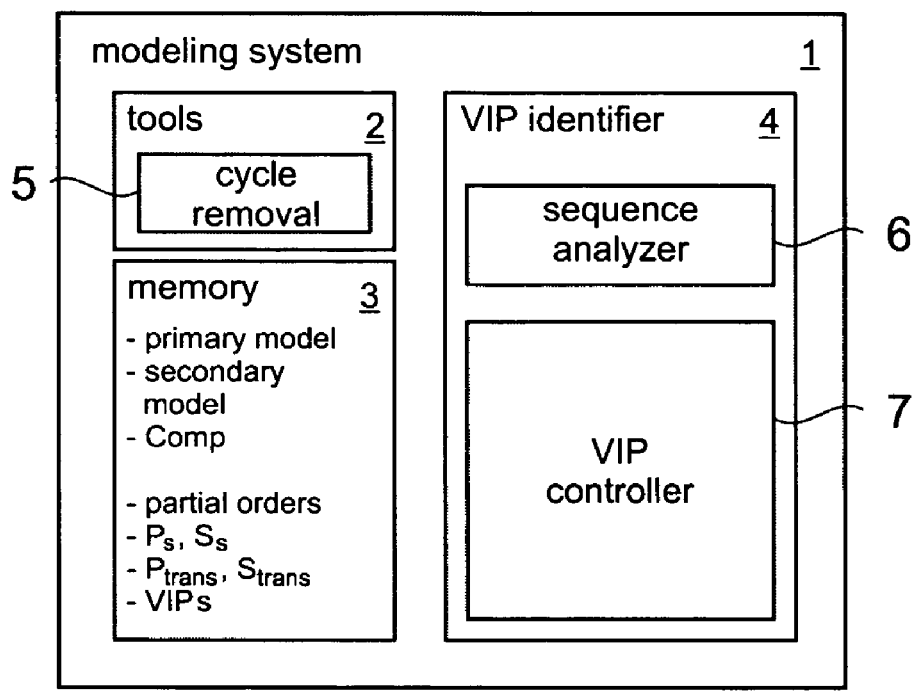
FIG. 1 is a schematic representation of a modeling system incorporating a VIP identification system embodying the invention.

FIG. 1 is a schematic representation of a modeling system, indicated generally at 1, showing the main components involved in the insertion point identification process. In this embodiment the system 1 is implemented by specialized software running on a computer with interfaces for an operator to provide inputs for set up and operation of the system as described below. The main components of system 1 are represented generally in the figure by software tools 2, memory 3, and a VIP identifier 4. The software tools 2 here include a cycle removal tool 5 discussed further below. The system memory 3 stores various information for operation of the system, including primary and secondary models, defined by respective software modules, and a comparison "Comp" of the two models described further below. The memory 3 also holds partial orders of the primary and secondary models, together with various other data generated in operation of the VIP identification process. This includes sets of predecessor and successor elements, $P_S$ and $S_S$ respectively, from the secondary model, sets of transferred predecessor and successor elements, $P_{trans}$ and $S_{trans}$ respectively, from the primary model, together with VIPs identified in operation of the system. The VIP identifier 4 comprises control logic in the form of a sequence analyzer 6 and a VIP controller 7. In this embodiment the sequence analyzer 6 and VIP controller 7 are implemented by software modules running on computer system 1, though in general the control logic of VIP identifier 4 could be implemented in hardware, software or a combination thereof. The VIP identifier 4 performs the core insertion point identification process, and suitable software for implementation of this will be apparent to those skilled in the art from the following description of operation.

Figure 2:
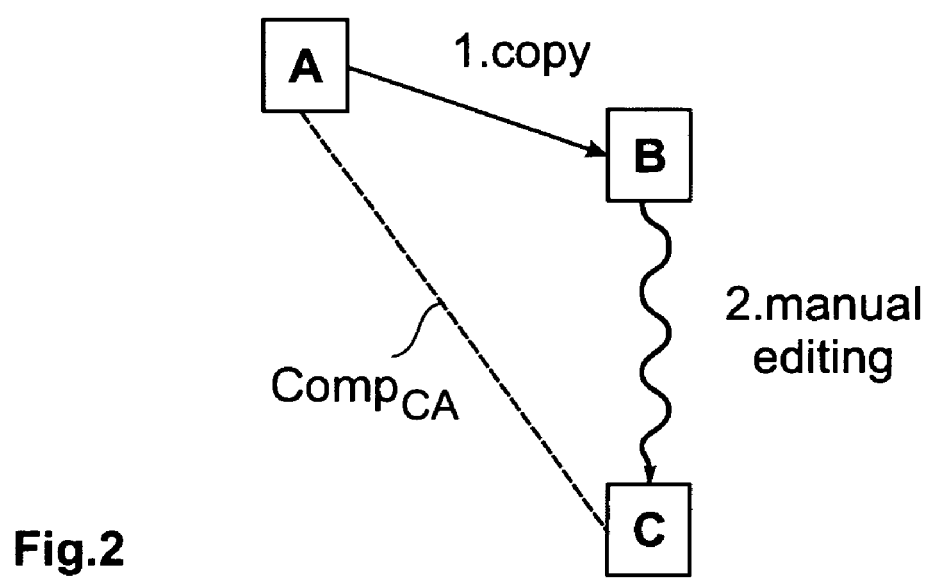
FIG. 2 illustrates a scenario where merging of two models may be required.

The insertion point identification process will be described below in relation to merging of two process models, and an exemplary scenario where such a merging operation may be required is illustrated in FIG. 2. Here it is assumed that an initial model A is stored in system 1 and, as part of a modeling process using general modeling tools 2, the model A is copied to produce a copy-model B. The copy B is then manually edited by an operator to produce another model C. A merging operation is then required on models A and C, for example because A is a reference model and model C is required to possess some level of conformity with the reference model. As part of this merging process, it is assumed that an element t of model A must be added to model C. Model C is thus the primary model, also referred to as first model, and model A the secondary model, also referred to as second model. The insertion point identification process to be described serves to locate all VIPs in model A for the element t. There are of course various other merging scenarios. For example, two copy-models might be made and independently edited, a merging operation then being required to consolidate the resulting models. The scenario of FIG. 2 merely provides an example of a merge operation in which insertion point identification is required.

A basis for the insertion point identification process is a comparison $Comp_{CA}$ of the primary and secondary models which defines the correspondence between elements of the two models. Various systems are known for defining correspondences between model elements, for example as described in the documents referenced earlier. The preferred embodiment described here employs the correspondence system disclosed in the Küster et al. reference above. Briefly, using this system the comparison $Comp_{CA}$ can include different types of correspondences between elements of models C and A. A 1-1 correspondence indicates that two elements, in respective models, have the same semantics. A 1-0 correspondence specifies that for a given model element in C no corresponding element in A exists, the reverse being a 0-1 correspondence which specifies that for a model element in A no corresponding element in C exists. Further correspondences include the 1-many (1-m) correspondence and the many-1 (m-1) correspondence which specify that one element corresponds to a number of elements in the other model. By analyzing the correspondences between elements of models A and C in accordance with this system, the comparison $Comp_{CA}$ can be derived as a correspondences file for the two models specifying the identities of corresponding elements in the two models. The particular way in which this comparison is derived is not central to the present invention and need not be described here. In general, however, the comparison could be derived manually by an operator, e.g. with the aid of a comparison tool in tool set 2, or might be generated automatically by a suitably configured comparison tool. In any case, the resulting comparison $Comp_{CA}$ is stored in memory 3 for use in subsequent VIP identification operations.

The VIP identification process to be described takes into account the ordering of elements in both the primary and secondary models. To this end, the sequence analyzer 6 in VIP identifier 4 can process a given model to generate a partial order indicating the sequence order of elements in the model. The first time a VIP identification process is to be performed for the pair of models A, C, sequence analyzer 6 will access the models in memory 3 and perform the partial order generation process. For a given model, the partial order identifies all predecessor and successor relations of a given element in the model. In particular, it is defined:

a predecessor p of an element e is any element for which a directed edge exists that connects p with e;

a successor s of an element e is any element for which a directed edge exists that connects e with s;

predecessor and successor definitions are transitive.

Following this definition, any two elements a and b from the same process model can have three different types of sequential relationship:
- a is direct or transitive predecessor of b;
- a is direct or transitive successor of b;
- a and b are unordered under the partial order, which means that a and b do not have a predecessor or successor relationship, i.e. they are in parallel, concurrent or independent branches of the process model.

To avoid potential problems related to unstructured cycles, in this preferred embodiment, prior to generation of a partial order, the sequence analyzer 6 is operable to analyze the model in question to detect the presence of unstructured cycles. If unstructured cycles are detected, sequence analyzer 6 invokes operation of the cycle removal tool 5 to transform the unstructured cycles to structured cycles. The cycle removal operation is not central to the present invention and need not be described in detail here. In this embodiment, however, the cycle removal operation implemented by tool 5 is that described in Hauser et al., "Compiling Process Graphs into Executable Code", 3rd International Conference on Generative Programming and Component Engineering (GPCE), LNCS 3286, pages 317-336, 2004. This operation results in a hierarchical and possibly concurrent model with structured cycles. Having invoked the cycle removal operation as necessary, sequence analyzer 6 can generate a partial order on each of models A and C by iterating over all edges within the model and using the following rules:

For a given edge (x, y) between a pair of adjacent elements x and y
- x is predecessor of y (x<y)
- if y is a sub-process or loop, then x is also predecessor of all direct children of y
- if x is a sub-process or loop, then all direct children of x are also predecessors of y
- if x and y are sub-processes or loops, then all direct children of x are also predecessors of all direct children of y.

These rules are applied on all edges within the considered process including all edges within loops, and sub-processes on lower hierarchy levels. The predecessor relation described above is transitive. The inversion of this predecessor relation results in the successor relation. The particular algorithm implemented by sequence analyzer 6 for generation of a partial order for a given process model A, C is as follows:

```
// Create a new partial order over the given process.
Method extractPartialOrder(Process)
    Create new empty PartialOrder
    extractPartialOrder(process, new partialOrder)
End Method
// Create all partial order elements for the given process and add them to
// the existing partial order.
Method extractPartialOrder(process, partialOrder)
    Foreach element x directly within process do
        Find all direct successors of x succX in the controlflow.
        Foreach succX do
            // Create the order relationship on the current hierarchy level.
            Add order relationship (x < succX) to partialOrder.
            // Create the order relationship(s) between children of a process
            and the
                // current hierarchy level. Every process is exactly once "x" and
                the partial
                // order of its children is generated exactly then.
            If x and succX are processes
                Add order relationships (childX, succX) between each child of
                x that has no successors and succX.
                Add order relationships (x, childSuccX) between x and each
                child of succX that has no predecessor.
                Add order relationships (childX, childSuccX) for all
                combinations of children of x that has no successors and
                children of succX that has no predecessors.
                extractPartialOrder(x, partialOrder)
            Else If x is a process         // succX is not a process
                Add order relationships (childX, succX) between each child of
                x that has no successors and succX.
                extractPartialOrder(x, partialOrder)
            Else If succX is a process     // x is not a process.
                Add order relationships (x, childSuccX) between x and each
                child of succX that has no predecessor.
}
            generateTaskToProcessOrderElements(partialOrder, x, succX)
        End Foreach
    End Foreach
    Return partialOrder
End Method End Method
```

Partial orders of models A and C generated by the above process are stored in system memory 3. The system is then ready to perform the VIP identification process for any element of secondary model A to be inserted in primary model C. VIP identifier 4 performs this process automatically in response to operator input identifying the element t to be added to model C. The main steps of this process are indicated in the flow chart of FIG. 3. In this figure, the step shown in broken lines is performed in an alternative embodiment to be described later and can be ignored in the immediate description of the present embodiment. Identification of the element t is represented by step 10 in FIG. 3. In response, in step 11 the sequence analyzer 6 analyses the sequence order of elements in the secondary model A to identify predecessors and successors of the element t in model A. This is done by processing the partial order, previously stored in memory 3, for model A in a manner described further below. The resulting sets of predecessor elements $P_S$ and successor elements $S_S$ are then stored in memory 3. Next, in step 12 the sequence analyzer 6 uses the correspondence information defined by comparison $Comp_{CA}$ to effectively transfer the predecessors $P_S$ and successors $S_S$ to the primary model C. Specifically, sequence analyzer 6 derives a set of transferred predecessors and a set of transferred successors for the element t where:
- the transferred predecessors of t is the set $P_{trans}$ of all model elements in the primary model C such that their correspondence element(s) is an element of $P_S$; and
- the transferred successors of t is the set $S_{trans}$ of all model elements in the primary model C such that their correspondence element(s) is an element of $S_S$.

The particular algorithm implemented by sequence analyzer 6 for this purpose will be given below.

The sets of transferred predecessors and successors $P_{trans}$ and $S_{trans}$ generated in step 12 are stored in system memory 3. The subsequent steps of the VIP identification process are performed by VIP controller 7. This process involves checking each edge (x, y) between pairs of adjacent model elements x and y in C to determine if the edge is a VIP for the element t. Specifically, in step 14 the VIP controller 7 selects the first edge (x, y) in model C and then, in step 14, compares the positions of the elements x, y in the sequence order of model C with the positions of the transferred predecessors and successors $P_{trans}$, $S_{trans}$. In decision step 15 the VIP controller determines, based on the results of the comparison step, whether the position of edge (x, y) in the model C sequence order is inconsistent with the sequence order of element t and its predecessors and successors in model A. The particular rules applied in steps 14 and 15 to check for inconsistency will be described in detail below. In this embodiment, however, the VIP controller is operable in two modes: a strict mode, wherein a strict test is implemented in steps 14 and 15; and a relaxed mode wherein a more relaxed test is applied in these steps. The VIP controller is initially set to the strict mode, so the strict test is applied in this initial pass of the VIP identification process. If the position of edge (x, y) is deemed not inconsistent with the required sequence order in step 15, then in step 16 this edge will be stored in memory 3 as a VIP and operation proceeds to step 17. If, on the other hand the edge position is deemed inconsistent in step 15, edge (x, y) is not a VIP and operation proceeds directly to step 17. Here, controller 7 decides if all edges in C have been checked. If not, operation reverts to step 13 where the next edge (x, y) is selected, and the process just described is repeated. Once all edges have been checked at step 17, the operation proceeds to decision step 18 where the current operating mode is checked. If the current mode is the strict mode, then VIP controller checks in step 19 whether the VIP set in memory 3 is empty, signifying that no VIPs have been identified by applying the strict mode conditions. If not, then the VIP set stored in memory 3 is displayed to an operator in step 20, and the process is complete. If, however, the VIP set is empty in step 19, then operation proceeds to step 21 where the mode setting is changed to the relaxed mode, and the operation reverts to step 13 again for a second pass of the VIP identification process, this time applying the relaxed mode conditions in steps 14 and 15. When the second pass has been completed and step 18 is again reached, operation will proceed from here to step 20 where the VIP set stored in memory 3 is displayed to an operator, and the process is then complete. The identified VIPs can be displayed in any convenient manner, for example by indicating their positions on a representation of the control flow of model C. In any case, edges identified as VIPs represent appropriate positions in the control flow of C at which the element t can be added, where it is assumed here that a VIP will add the element sequentially to the existing control flow and will not create new parallel or concurrent branches. After the insertion of the element t at a VIP edge (x, y), e.g. in response to selection by the operator, the resulting sequence will be given by two edges e1(x, t) and e2(t, y).

Figure 3:
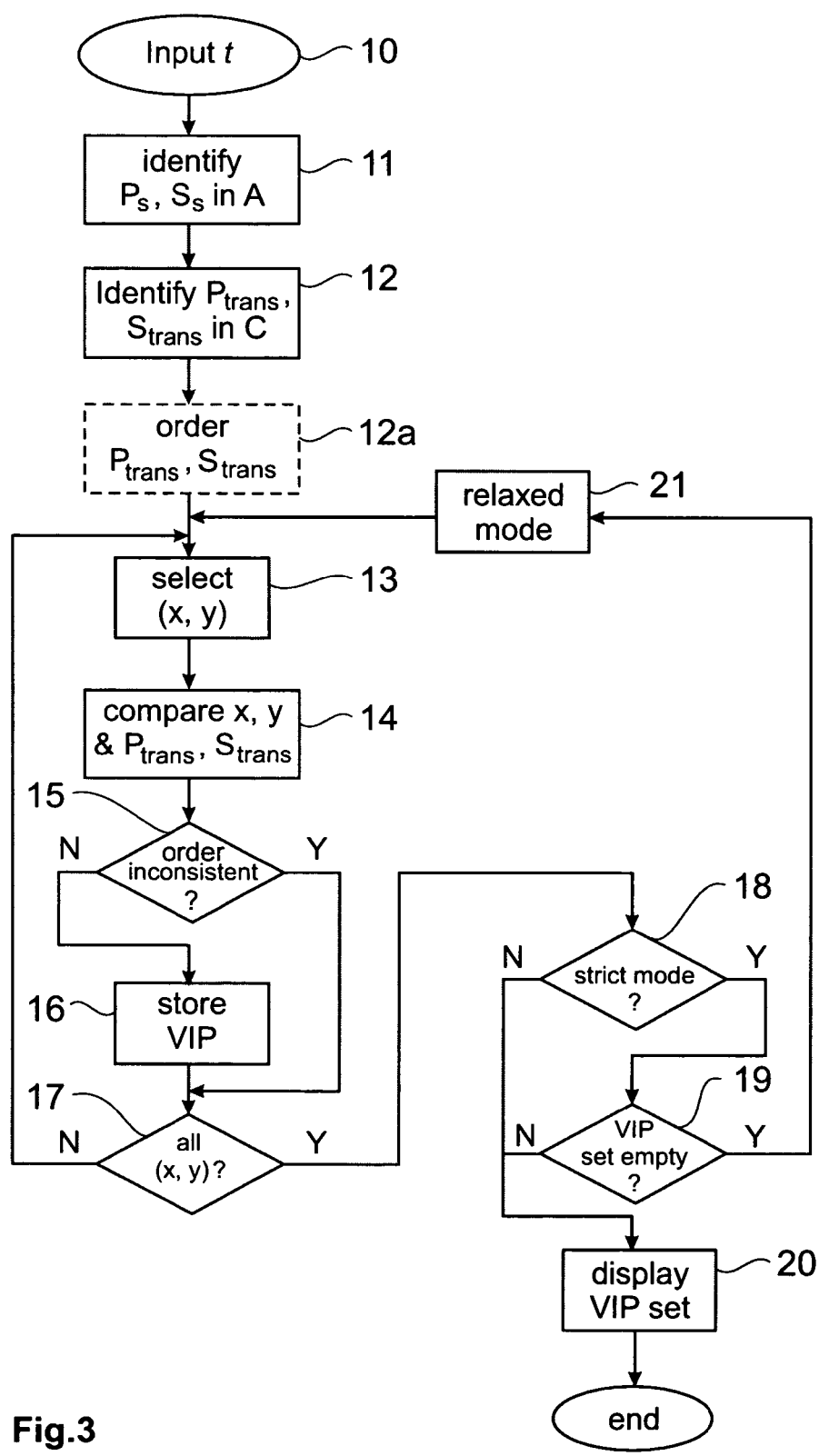
FIG. 3 is a flow chart illustrating operation of a VIP identifier in the FIG. 1 system.

The step of identifying the predecessor elements $P_S$ and successor elements $S_S$ for the element t in step 11 of the FIG. 3 process will now be described in more detail. Using the partial order of the secondary model A, the set of predecessors of a given element within the process can be identified by starting at the given element and recursively searching for all transitive predecessor relationships, i.e. calculating the forward directed transitive closure. The particular algorithm implemented by sequence analyzer 6 in this embodiment is as follows.

```
// Finds recursively all (direct and transitive) predecessors for a given
// element using a given partial order.
Method findPredecessors(partialOrder, element)
    Create new Set predecessors
    // Find all direct predecessors
    Foreach partial order element (x, y) of partialOrder do
        If y == element
            Add x to predecessors
    End Foreach
    // Find transitive predecessors
    Foreach element p in predecessors
        Run findPredecessors(partialOrder, p) and add the results to
            predecessors
    End Foreach
    Return predecessors
End Method
```

Similarly, the successors of a given element can be identified by starting at the given element and recursively searching for all transitive successor relationships, i.e. calculating the backward directed transitive closure. Thus, the successor set $S_S$ can be derived by applying the above algorithm to successor elements.

Operation of the sequence analyzer to calculate the transferred predecessors and successors $P_{trans}$ and $S_{trans}$ in step 12 of the FIG. 3 process is as follows. For each predecessor/successor identified in step 11 the correspondences are checked in the correspondences file $Comp_{CA}$ stored in memory 3. Each element in the primary model C that corresponds to a predecessor in the secondary model A is stored as transferred predecessor. Each element in the primary model C that corresponds to a successor in the secondary model A is stored as transferred successor. (Considering 1-m correspondences, it is possible that there are elements in the primary model that exist in both sets at the same time). The following algorithm implemented by sequence analyzer 6 describes this process.

```
Method getElementsInPrimary(elementsInSecondary,
    correspondencesFile)
    Create a new Set elementsInPrimary
    Foreach element e in elementsInSecondary
        Get the correspondence corr for e from correspondencesFile
        Add all elements in the primary model to which corr points to
            elementsInPrimary
    End Foreach
    Return elementsInPrimary
End Method
```

The strict and relaxed operating modes of VIP controller 7 will now be explained in more detail. Using the partial order definition given above we distinguish between two different definitions for a VIP, a strict and a relaxed definition. The strict definition determines that a valid insertion point preserves all predecessor and successor relations that are given in the secondary model. This means that all transferred predecessors have to be a predecessor of a VIP and that all transferred successors have to be a successor of a VIP. Thus, in the strict operating mode, the edge (x,y) is a valid insertion point for the element t if and only if:

(a) x is successor to all elements in $P_{trans}\setminus\{x\}$, and
(b) y is predecessor to all elements in $S_{trans}\setminus\{y\}$.

Figure 4:
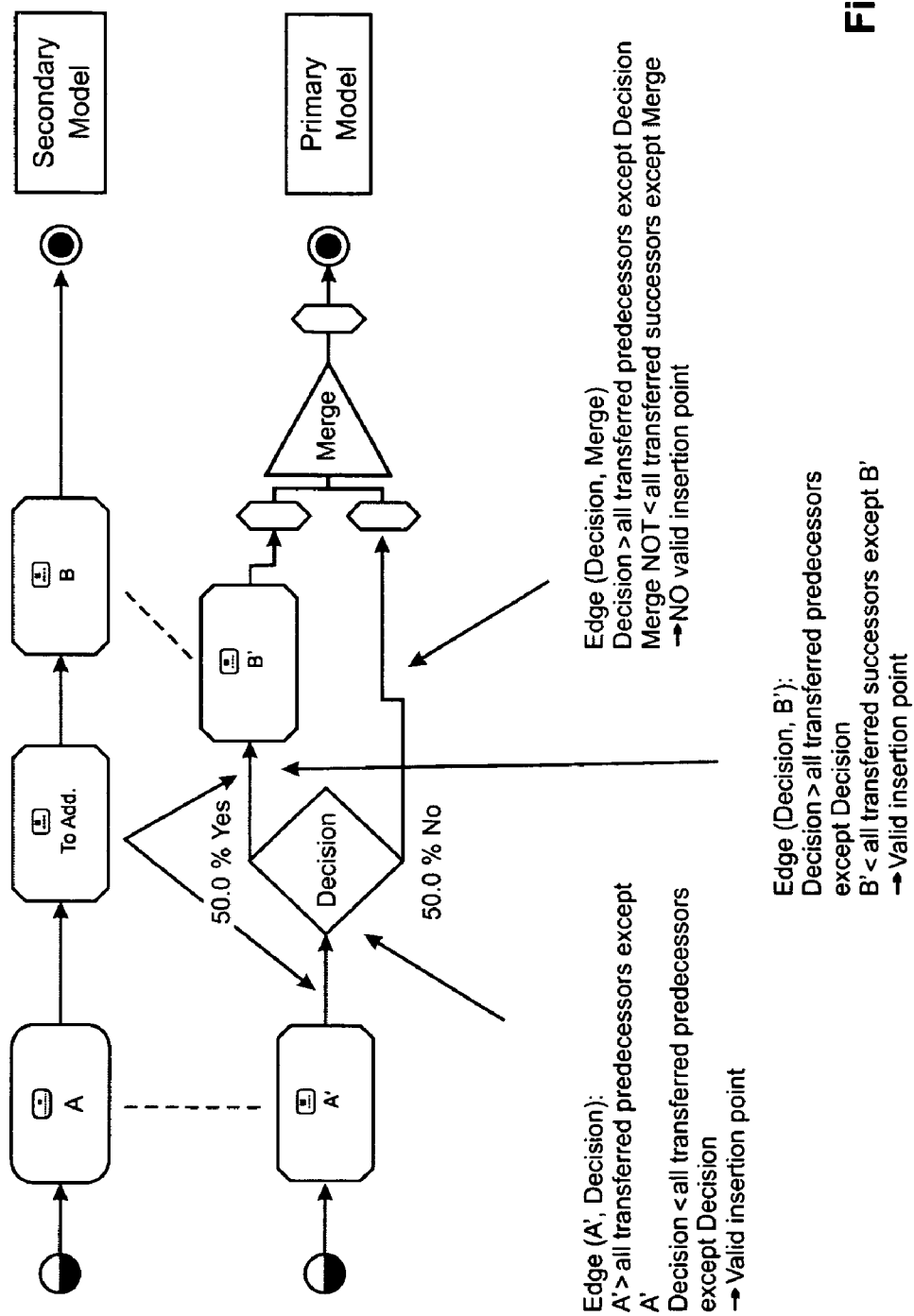
FIG. 4 illustrates identification of VIPs in a strict operating mode of the system.

FIG. 4 illustrates application of this definition for a case of a secondary model with elements A, toAdd, and B, and a primary model with elements A', Decision, B' and Merge, where "toAdd" is the element t to be inserted in the primary model. Correspondences between elements are indicated by the broken lines. Valid and invalid insertion points with the strict definition are indicated in the figure. For example, the edge (A', Decision) is a valid insertion point because A' is greater than all transferred predecessors of the element toAdd. In this case the set of all transferred predecessors just contains A' itself and the set of all transferred successors contains B'. As the Decision is smaller than B', the edge is a valid insertion point.

Sometimes, the strict definition of a valid insertion point needs to be relaxed in order to find a possible insertion point at all. This is the idea of the relaxed mode of operation. The relaxed definition simply requires that a valid insertion point does not contradict the predecessor and successor relations that are given in the secondary model. This means here that all transferred successors/predecessors are either successors/predecessors of the VIP or do not have an order relationship with respect to the VIP. Specifically, in the relaxed operating mode, the edge (x,y) is a valid insertion point for the element t if and only if:

(c) x is either a successor of or not ordered with respect to all elements in $P_{trans}\setminus\{x\}$, OR (d) x is a disjunctive element that does not fulfill (c) AND y fulfills requirement (c),

AND (e) y is either a predecessor of or not ordered with respect to all elements in $S_{trans}\setminus\{y\}$, OR (f) y is a conjunctive element that does not fulfill (e) AND x fulfills requirement (e).

Figure 5:
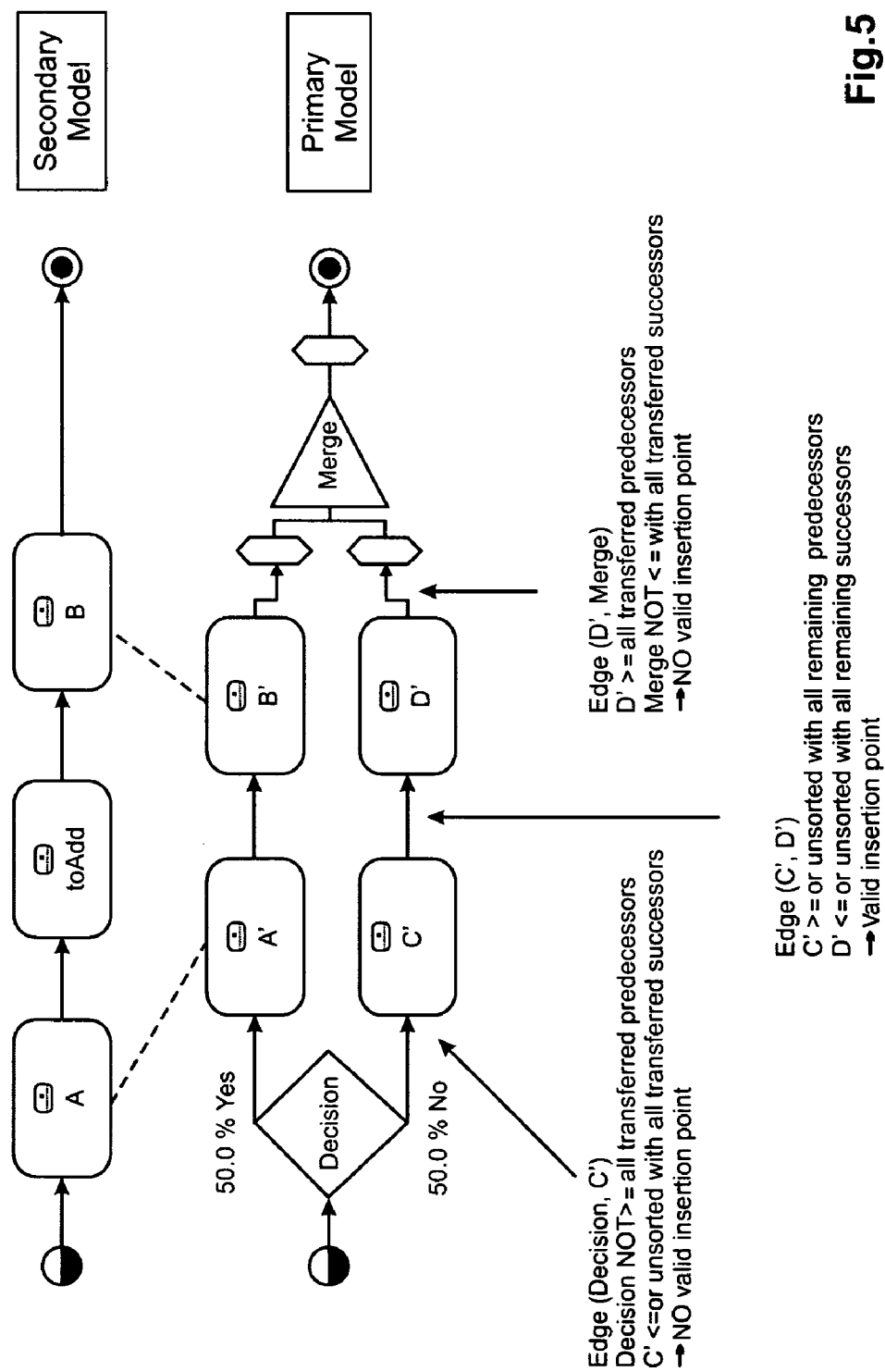
FIG. 5 illustrates identification of VIPs in a relaxed operating mode of the system.

In this definition, a disjunctive element is a fork or decision element and a conjunctive element is a join or merge element. It might be considered that rules (c) and (e) would suffice for the relaxed definition. However, a definition reduced to these rules would lead to undesired side effects in parallel or concurrent regions. This would be the case if: there is at least one transferred predecessor within one of the parallel branches; there is another parallel branch that does not contain any transferred predecessors; the decision itself is not a transferred successor. In this case the element "toADD" could not be added directly after the decision, but could be added after the next element, as shown in the example of FIG. 5. This figure shows that the edges (Decision, C') and (D', Merge) are not considered as valid insertion points using only criteria (c) and (e) of the relaxed definition, although it would be expected that they are VIPs because they do not produce a conflict regarding the transferred predecessors and successors. The same situation can be described symmetrically for the end of a concurrent region as shown in the figure. This problem is overcome by adding rules (d) and (f) specifically designed for these situations.

The valid insertion points in the primary model can be identified by iterating over all edges in the primary model and checking whether this edge is a VIP according to the test appropriate to the current operating mode. This check is performed by applying the test while comparing x with the transferred predecessors and comparing y with the transferred successors. As described above, the strict VIP definition is used for the comparisons in a first iteration. If at least one VIP is found, the resulting VIPs are returned as valid insertion points. However, if no VIP is found, a second iteration is executed using the relaxed definition, and the results of this second iteration are returned as valid insertion points. The following algorithm describes the process performed by VIP controller 7 in each mode, the entirety of valid insertion points being referred to as the Input Region here.

```
Method identifyInputRegion(partialOrderPrimary, transferredPredecessors,
                           transferredSuccessors)
    Create new Set vips
    Foreach each edge (x, y) in the primary model do
        // Either the strict or the relaxed definition can be checked.
        If (x, y) fulfills the definition for a valid insertion point
            Add (x, y) to vips
    End Foreach
End Method
1
```

It will be seen that the above embodiment provides an effective technique for automatic identification of valid insertion points for addition of an element to the process model C. The sequence order of elements in both primary and secondary models is respected, allowing the added element to be integrated into the existing control flow without violating sequence requirements, while at the same time avoiding manual overhead during process merging. The technique described can be applied even if the control flow between elements is completely different in the primary and secondary models. In such a situation the system described can find a valid insertion point for an isolated element without requiring to commit additional changes that exist between the two models. In addition, the described technique can also deal with complex correspondences between elements such as 1-to-many correspondences as described above.

Various modifications can of course be made to the specific embodiment described above. For example, the comparison performed in step 14 of FIG. 4 can be accelerated by inclusion of step 12a shown in broken lines in the figure. Here, the sets of transferred predecessors and successors $P_{trans}$, $S_{trans}$ are sorted into sequence order. Subsequently in step 14, the element x need only be compared with the sequentially last transferred predecessor and the element y with the sequentially first transferred successor.

While the above embodiment is operable in both strict and relaxed operating modes as described, alternative embodiments could offer only a single operating mode as appropriate. Also, while the system 1 has been described for simplicity in terms of operation of a single computer, it will of course be appreciated that elements of the FIG. 1 system could be provided in different physical components of a distributed computer system if desired. Moreover, while operation of the above embodiment has been described with specific reference to process models, the system might also be applied with other types of models, e.g. state machines and sequence diagrams, where sequencing is relevant. Various other changes and modifications can be made to the embodiments described without departing from the scope of the invention.

The invention claimed is:

1. A method for automatic identification, performed by a processing device of a computer in a data processing system, of an insertion point in a first model stored in memory of the computer for a predetermined element t of a second model, the method comprising the computer processing device performing insertion point identification process steps of:

providing in the memory a comparison of first and second models defining correspondence between elements of the models;

analyzing a sequence order of elements in the second model to identify predecessor and successor elements of element t in the second model;

using said comparison to identify a set of first model predecessors, comprising elements of the first model which correspond to said predecessor elements in the second model, and a set of first model successors comprising elements of the first model which correspond to said successor elements in the second model; and for pairs of adjacent elements x, y in the first model, comparing positions of the elements x, y in a sequence order of the first model with positions of elements in the sets of first model predecessors and successors, and determining if a position of an edge between elements x and y relative to the first model predecessors and successors is not inconsistent with the sequence order of the element t and the predecessor and successor elements in the second model and identifying the edge as an insertion point if the position of the edge between elements x and y is determine to be consistent; wherein the position of the edge relative to the first model predecessors and successors is deemed not inconsistent with said sequence order in the second model if:

(c) the element x is either a successor of, or is not ordered with respect to, all first model predecessors, OR (d) the element x is a disjunctive element that does not satisfy condition (c) AND the element y is either a successor of, or is not ordered with respect to, all first model predecessors

AND (e) the element y is either a predecessor of, or is not ordered with respect to, all successors, OR (f) the element y is a conjunctive element that does not satisfy condition (e) AND the element x is either a predecessor of, or is not ordered with respect to, all successors.

2. A method according to claim 1, wherein the position of the edge relative to the first model predecessors and successors is deemed not inconsistent with said sequence order in the second model:

in a first mode, if and only if conditions (a) and (b) are satisfied wherein condition (a) requires that the element x is a successor of all first model predecessors; and condition (b) requires that the element y is a predecessor of all first model successors; and in a second mode, if and only if either condition (c) or condition (d), AND either condition (e) or condition (f), are satisfied.

3. A method according to claim 1 wherein the position of the edge relative to the first model predecessors and successors is deemed not inconsistent with said sequence order in the second model in a first mode, if and only if conditions (a) and (b) are satisfied, wherein condition (a) requires that the element x is a successor of all first model predecessors; and condition (b) requires that the element y is a predecessor of all first model successors and in a second mode, if and only if either condition (c) or condition (d), AND either condition (e) or condition (f), are satisfied, wherein the method includes operating in said first mode in a first pass of the insertion point identification process, and, if no insertion point is identified in the first pass, operating in said second mode in a second pass of the insertion point identification process.

4. A method according to claim 1 including providing in the memory a partial order of the second model indicative of the sequence order of elements in that model, and processing the partial order to identify said predecessor and successor elements of the element t.

5. A method according to claim 4 wherein the second model is stored in the memory, the method including analyzing the second model to generate said partial order.

6. A method according to claim 1 including performing said step of comparing the positions of the elements x, y in the sequence order of the first model for every pair of adjacent elements x, y in the first model.

7. A method according to claim 1 including analyzing the first model to generate a partial order indicative of the sequence order of elements in that model, and processing the partial order to compare the positions of the elements x, y in the sequence order of the first model with the positions of elements in the sets of first model predecessors and successors.

8. A method according to claim 1 including:

analyzing the sequence order of elements in the sets of first model predecessors and successors to identify a sequentially last first model predecessor and a sequentially first model successor; and performing said step of comparing by comparing the positions of the elements x, y with the positions of the sequentially last first model predecessor and the sequentially first model successor.

9. A method according to claim 1 including analyzing the first model to detect unstructured cycles, and, if an unstructured cycle is detected, applying a cycle removal operation to the model to transform the unstructured cycle to a structured cycle.

10. A non-transitory computer-usable storage medium having embodied therein computer-readable program code means for causing a data processing system to perform a method for automatic identification, in a data processing system, of an insertion point in a first model stored in memory of the system for a predetermined element t of a second model, the method comprising:

providing in the memory a comparison of first and second models defining correspondence between elements of the models;

analyzing a sequence order of elements in the second model to identify predecessor and successor elements of element t in the second model;

using said comparison to identify a set of first model predecessors, comprising elements of the first model which correspond to said predecessor elements in the second model, and a set of first model successors comprising elements of the first model which correspond to said successor elements in the second model; and for pairs of adjacent elements x, y in the first model, comparing positions of the elements x, y in a sequence order of the first model with positions of elements in the sets of first model predecessors and successors, and determining if a position of an edge between elements x and y relative to the first model predecessors and successors is not inconsistent with the sequence order of the element t and the predecessor and successor elements in the second model and identifying the edge as an insertion point if the position of the edge between elements x and y is determine to be consistent wherein the position of the edge relative to the first model predecessors and successors is deemed not inconsistent with said sequence order in the second model if:

(c) the element x is either a successor of, or is not ordered with respect to, all first model predecessors, OR (d) the element x is a disjunctive element that does not satisfy condition (c) AND the element y is either a successor of, or is not ordered with respect to, all first model predecessors

AND (e) the element y is either a predecessor of, or is not ordered with respect to, all successors, OR (f) the element y is a conjunctive element that does not satisfy condition (e) AND the element x is either a predecessor of, or is not ordered with respect to, all successors.

11. A computer system for automatic identification of an insertion point in a first model for a predetermined element t of a second model, the computer system comprising memory for storing the first model and a comparison of the first and second models which defines the correspondence between elements of the models, and processor with control logic adapted to perform an insertion point identification process by:

analyzing a sequence order of elements in the second model to identify predecessor and successor elements of element t in the second model;

using said comparison to identify a set of first model predecessors, comprising elements of the first model which correspond to said predecessor elements in the second model, and a set of first model successors comprising elements of the first model which correspond to said successor elements in the second model; and for pairs of adjacent elements x, y in the first model, comparing the positions of the elements x, y in the sequence order of the first model with the positions of elements in the sets of first model predecessors and successors, and determining if a position of an edge between elements x and y relative to the first model predecessors and successors is not inconsistent with the sequence order of the element t and the predecessor and successor elements in the second model and identifying the edge as an insertion point if the position of the edge between elements x and y is determine to be consistent wherein the position of the edge relative to the first model predecessors and successors is determined to be not inconsistent with said sequence order in the second model if:

(c) the element x is either a successor of, or is not ordered with respect to, all first model predecessors, OR (d) the element x is a disjunctive element that does not satisfy condition (c) AND the element y is either a successor of, or is not ordered with respect to, all first model predecessors

AND (e) the element y is either a predecessor of, or is not ordered with respect to, all successors, OR (f) the element y is a conjunctive element that does not satisfy condition (e) AND the element x is either a predecessor of, or is not ordered with respect to, all successors.

12. A system according to claim 11, wherein the control logic is adapted to determine that the position of the edge relative to the first model predecessors and successors is not inconsistent with said sequence order in the second model:

in a first mode, if and only if conditions (a) and (b) are satisfied wherein condition (a) requires that the element x is a successor of all first model predecessors; and condition (b) requires that the element y is a predecessor of all first model successors; and in a second mode, if and only if either condition (c) or condition (d), AND either condition (e) or condition (f), are satisfied.

13. A system according to claim 11, wherein the control logic is adapted:

to determine that the position of the edge relative to the first model predecessors and successors is not inconsistent with said sequence order in the second model in a first mode, if and only if conditions (a) and (b) are satisfied, wherein condition (a) requires that the element x is a successor of all first model predecessors; and condition (b) requires that the element y is a predecessor of all first model successors, and in a second mode, if and only if either condition (c) or condition (d), AND either condition (e) or condition (f), are satisfied; and to operate in said first mode in a first pass of the insertion point identification process, and, if no insertion point is identified in the first pass, to operate in said second mode in a second pass of the insertion point identification process.

14. A system according to claim 11 wherein the control logic is adapted to process a partial order of the second model, stored in said memory and indicative of the sequence order of elements in the second model, to identify said predecessor and successor elements of the element t.

15. A system according to claim 14 wherein the second model is stored in the memory and wherein the control logic is adapted to analyze the second model to generate said partial order.

16. A system according to claim 11 wherein the control logic is adapted to perform the step of comparing positions of the elements x, y and elements in the sets of first model predecessors and successors for every pair of adjacent elements x, y in the first model.

17. A system according to claim 11 wherein the control logic is adapted to analyze the first model to generate a partial order indicative of the sequence order of elements in that model, and to perform the step of comparing the positions of the elements x, y and elements in the sets of first model predecessors and successors by processing the partial order of the first model.

18. A system according to claim 11 wherein the control logic is adapted to:

analyze the sequence order of elements in the sets of first model predecessors and successors to identify a sequentially last first model predecessor and a sequentially first model successor; and perform the step of comparing the positions of the elements x, y and elements in the sets of first model predecessors and successors by comparing the positions of the elements x, y with the positions of the sequentially last first model predecessor and the sequentially first first model successor.

19. A system according to claim 11 wherein the control logic is adapted to analyze the first model to detect unstructured cycles, and, if an unstructured cycle is detected, to apply a cycle removal operation to the model to transform the unstructured cycle to a structured cycle.

* * * * *